United States Patent [19]

Kaneko

[11] 4,398,179
[45] Aug. 9, 1983

[54] ANALOG-TO-DIGITAL CONVERTING CIRCUIT

[75] Inventor: Shinji Kaneko, Sagamihara, Japan

[73] Assignee: Sony Corporation, Tokyo, Japan

[21] Appl. No.: 326,324

[22] Filed: Dec. 1, 1981

[30] Foreign Application Priority Data

Dec. 3, 1980 [JP] Japan ............................... 55-170710

[51] Int. Cl.$^3$ ............................................ H03K 13/02
[52] U.S. Cl. ........................ 340/347 AD; 340/347 DA
[58] Field of Search ... 340/347 AD, 347 M, 347 DA; 358/13, 133, 141; 324/99 D; 307/360, 361; 360/32

[56] References Cited

U.S. PATENT DOCUMENTS

| | | | |
|---|---|---|---|
| 3,656,152 | 4/1972 | Gundersen | 340/347 AD |
| 3,949,170 | 4/1976 | Shionoya | 358/141 |
| 4,183,016 | 1/1980 | Sawagata | 340/347 AD |
| 4,345,241 | 8/1982 | Takeuchi | 340/347 AD |

Primary Examiner—C. D. Miller
Attorney, Agent, or Firm—Lewis H. Eslinger; Alvin Sinderbrand

[57] ABSTRACT

An analog-to-digital converting circuit comprises an input, a clock signal circuit providing first and second clock signals having the same frequency but having a half-cycle phase difference therebetween; first and second analog-to-digital converting stages each having an input coupled to the converting circuit input for receiving an input analog signal, a control terminal for receiving a respective one of the first and second control clock signals, and an output providing an N-bit binary-coded digital signal representing the level of the input analog signal, each having a voltage quantizing interval of $\Delta V$; an output terminal; and a multiplexing circuit, such as a parallel-to-serial converter, for alternately applying to the output terminal the binary coded digital signals of the first and the second analog-to-digital converting stages. In order to achieve greater accuracy, an offset circuit is included to provide to one of the first and the second analog-to-digital converting stages an offset voltage, relative to the other of such stages, of $\frac{1}{2}\Delta V$.

9 Claims, 8 Drawing Figures

4,398,179

ANALOG-TO-DIGITAL CONVERTING CIRCUIT

BACKGROUND OF THE INVENTION

1. Field of the Invention

This invention relates generally to analog-to-digital converters, and is more particularly directed to an analog-to-digital converter which can provide a digital signal having increased accuracy, but without incurring a concomitant increase in the bit number thereof.

2. Description of the Prior Art

When a color video signal, for example, a composite color video signal according to the NTSC system, is digitized, a sampling frequency of 4 $f_{sc}$ is typically used (where $f_{sc}$ is the frequency of the color subcarrier) and each sample is converted to a word or byte of eight bits. When the accuracy of a reproduced picture derived from the digital video signal is inadequate, it is possible to increase the sampling frequency, or to convert each sample into nine-bit bytes. While these approaches can provide a digital video signal with reduced quantizing error and increased accuracy, they require a complete change of equipment, both in the analog-to-digital converter and also in the associated digital-to-analog converter.

In the case of digital video recording, it is desirable to provide recorded digital signals such that any quantizing errors are reduced, but no circuit changes are required in the digital-to-analog converter of the associated reproducing apparatus.

OBJECTS AND SUMMARY OF THE INVENTION

Accordingly, it is an object of the present invention to provide a novel analog-to-digital converting circuit suitable for producing a digital video signal of increased accuracy.

It is another object of this invention to provide an analog-to-digital converting circuit capable of being driven at high speed, and having a resolving power of N+1 bits, although converting an analog signal to a digital signal of only N bits.

It is a further object of this invention to provide an analog-to-digital converting circuit which, although having a quantizing step voltage of $\Delta V$, has an accuracy as though the quantizing step voltage were only $\frac{1}{2}\Delta V$.

According to an aspect of this invention, an analog-to-digital converting circuit comprises an input for receiving an analog signal to be converted to digital form; a clock signal circuit for generating first and second control clock signals having the same frequency but having a half-cycle phase difference therebetween; first and second analog-to-digital converting stages each having an input coupled to the converting circuit input for receiving the input analog signal, a control terminal for receiving a respective one of the first and the second control clock signals, and an output providing an N-bit binary-coded digital signal representing the level of the input analog signal, and each having a voltage quantizing step of $\Delta V$; an output terminal; and a multiplexing circuit, such as a parallel-to-serial converter, for alternately applying to the output terminal the binary coded digital signals of the first and the second analog-to-digital converting stages. In order to achieve increased accuracy, an offset circuit is included to provide to one of the first and the second analog-to-digital converting stages an offset voltage, relative to the other of such stages, of $\frac{1}{2}\Delta V$.

In a preferred embodiment, the offset circuit includes a subtracting circuit having an input connected to the converting circuit input, an output connected to the input of the first converting stage, and another input coupled to a source of offset voltage $\frac{1}{2}\Delta V$. In an alternative arrangement, the offset circuit can include a voltage shifter for shifting by $\frac{1}{2}\Delta V$ the level of the reference voltage used by the first analog-to-digital converting stage.

The above and other objects, features and advantages of the present invention will become apparent from the ensuing detailed description of a preferred embodiment thereof, which is to be considered in conjunction with the accompanying drawings.

DETAILED DESCRIPTION OF A PREFERRED EMBODIMENT

Figure 1:
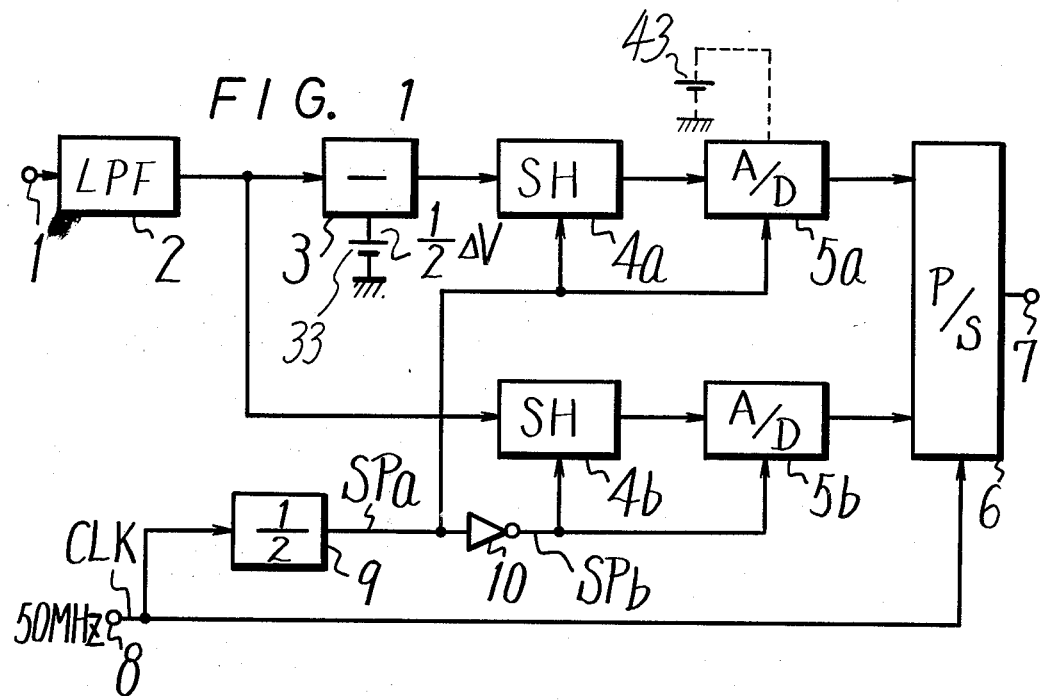
FIG. 1 is a schematic block diagram showing an embodiment of an analog-to-digital converting circuit according to the present invention.

A preferred embodiment of the analog-to-digital converting circuit of this invention is shown in schematic block diagram form in FIG. 1. In this embodiment, an input terminal 1 receives an analog signal to be converted, such as a color video signal. The analog signal is supplied therefrom through a low-pass filter 2 to an input of a subtractor circuit 3 whose output is coupled to a first sample hold circuit 4a. The low pass filter 2 is coupled directly to an input of another sample hold circuit 4b. Each of the sample hold circuits 4a and 4b is followed by a respective first and second analog-to-digital converter 5a and 5b. The latter each have a quantitizing step voltage of $\Delta V$: In other words, each of the converters 5a and 5b provides a binary coded digital signal whose least significant bit represents a voltage difference of $\Delta V$ volts. The converters 5a and 5b each have an output coupled to a respective input of a parallel-to-serial converter 6, which multiplexes the digital signals provided thereto and provides a serial signal constituted by alternating eight-bit bytes provided from the converters 5a and 5b.

In this embodiment, an offset voltage source 33 provides a voltage level of $\frac{1}{2}\Delta V$ to a subtracting input of the subtractor 3. In other words, the subtractor 3 provides to the sample hold circuit 4a a version of the input analog signal that is offset by one half the quantizing step $\Delta V$, relative to the input analog signal provided from the low pass filter 2 to the second sample hold circuit 4b.

In an alternative arrangement, in place of the subtractor 3 and the offset voltage source 33 in advance of the first sample hold circuit 4a, a $\frac{1}{2}\Delta V$ volt offset voltage source 43, shown in ghost lines in FIG. 1, can be coupled to the first analog-to-digital converter 5a to shift the reference voltage thereof by $\frac{1}{2}\Delta V$.

In this embodiment, a clock pulse signal CLK having a frequency of $f_{cp}$, for example, 50 MHz, is applied to a clock pulse input terminal 8 connected to a frequency divider 9 and also connected to a clock input of the parallel-to-serial converter 6. The frequency divider 9 then provides a first sampling pulse signal SPa of a frequency $\frac{1}{2} f_{cp}$ to the first sample hold circuit 4a and to the first analog-to-digital converter 5a. This sampling pulse signal $SP_a$ is also furnished to an inverter 10, which as a consequence provides a sampling pulse signal $SP_b$ having the same frequency $\frac{1}{2} f_{cp}$ as the first sampling pulse signal $SP_a$, but having a half-cycle phase difference therefrom. This second sampling pulse signal $SP_b$ is furnished to the second sample hold circuit 4b and to the second analog-to-digital converter 5b.

It should be appreciated that the clock pulse signal CLK furnished to the parallel-to-serial converter 6 causes the same to alternately select the digitized output of the first and second analog-to-digital converters 5a and 5b for a period of $1/f_{cp}$, so that a digital signal formed of alternating bytes from the first and second analog-to-digital converters 5a and 5b appears at the output terminal 7.

The operation of the above-described embodiment depicted in FIG. 1 can be explained with reference to FIGS. 2A through 2E. In this explanation, the analog input signal applied to the input terminal 1 is a slowly-changing signal, i.e., a signal which increases in level only gradually.

Figure 2A:
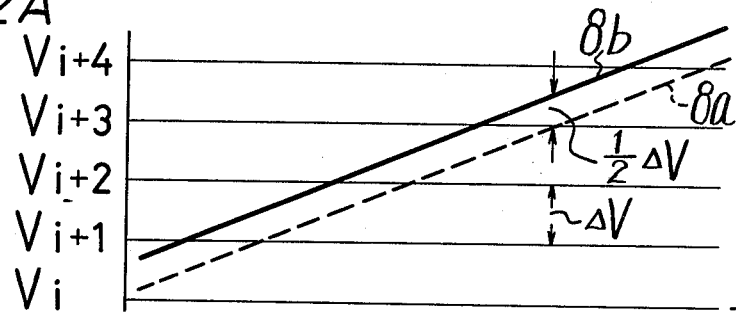
FIGS. 2A to 2E are waveform diagrams used in explaining the operation of the embodiment of FIG. 1.

This analog input signal appears at the input of the first sample hold circuit 4a as a gradually rising signal 8a, as shown in dash lines in FIG. 2A, while the same also appears as another gradually rising signal 8b, as shown as a solid line therein. The analog rising signals 8a and 8b have a constant level difference therebetween of $\frac{1}{2}\Delta V$, corresponding to the voltage of the offset voltage source 33.

Horizontal lines in FIG. 2A represent the quantization comparing levels $V_i$, $V_{i+1}$, . . . used in the analog-to-digital converters 5a and 5b, and adjacent such comparing levels are separated by the quantizing level difference $\Delta V$.

Figure 2B:
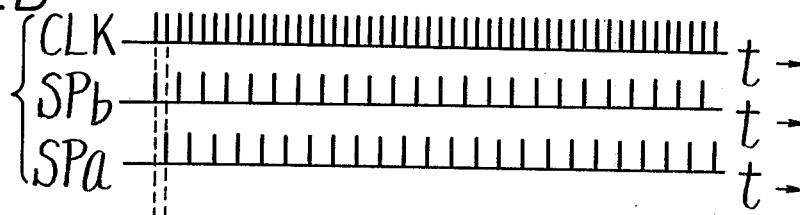
Figure 2C:
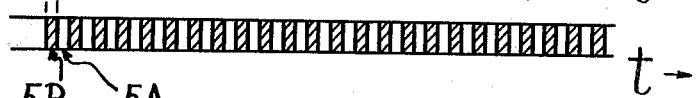

The first and second timing pulse signals $SP_a$ and $SP_b$, related to the clock signal CLK as shown in FIG. 2B, cause the respective first and second sample hold circuits 4a and 4b to sample and hold the input analog signals 8a and 8b during alternate periods 5A and 5B shown in respective clear and hatched blocks in FIG. 2C, and the sampled and held levels are quantized in the associated analog-to-digital converters 5a and 5b upon the occurrence of the respective sampling pulse signals SPa and SPb.

Figure 2D:
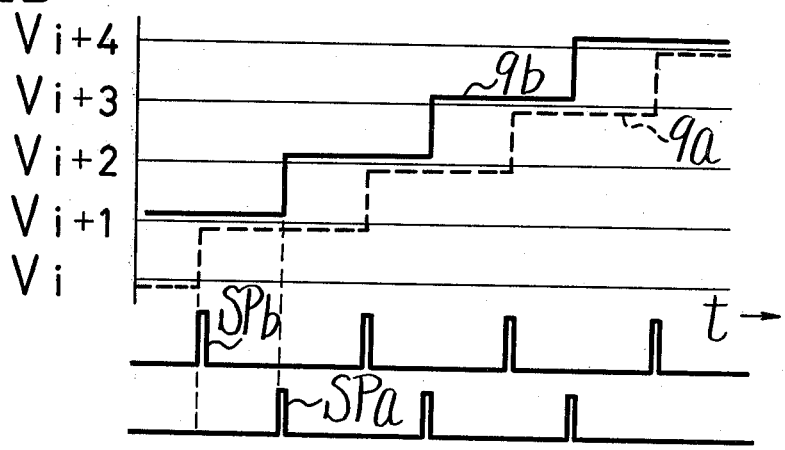

Within the analog-to-digital converters 5a and 5b, the sampled input levels 8a and 8b are quantized to the respective levels 9a and 9b, as illustrated in FIG. 2D. That is, when the analog input 8a is sampled by the sampling pulse signal SPa, the quantized level 9a, shown in dashed lines in FIG. 2D, is produced. Similarly, when the analog input 8b is sampled by the sampling pulse signal $SP_b$, the quantized level 9b, is produced, as shown by a solid line in that drawing.

It should be understood that the dash line 9a and the solid line 9b have been drawn in FIG. 2D slightly below and slightly above the quantization comparing levels $V_i$, $V_{i+1}$, . . . merely for the sake of illustration and explanation. In an actual circuit, the quantized levels 9a and 9b would not be so separated from the associated comparing levels.

The analog-to-digital converters 5a and 5b then produce eight-bit bytes at the sampling frequency $\frac{1}{2} f_{cp}$ to produce a binary-coded output signal.

The parallel-to-serial converter 6 is operated by the clock pulse signal CLK to produce a serialized output digital signal formed of eight-bit bytes from derived from the first analog-to-digital converter 5a during the periods 5A (FIG. 2C), alternating with the eight-bit bytes produced from the second analog-to-converter 5b during the periods 5B. That is, the digital outputs from the two analog-to-digital converters 5a and 5b, which carry out their digitization operation with a relative phase separation of 180 degrees, are passed alternately to the output terminal 7 at the period of the clock pulse signal CLK. Consequently, the digital output signal appearing at the output terminal 7 has an apparent sampling frequency equal to the frequency of the clock pulse signal CLK.

Figure 2E:
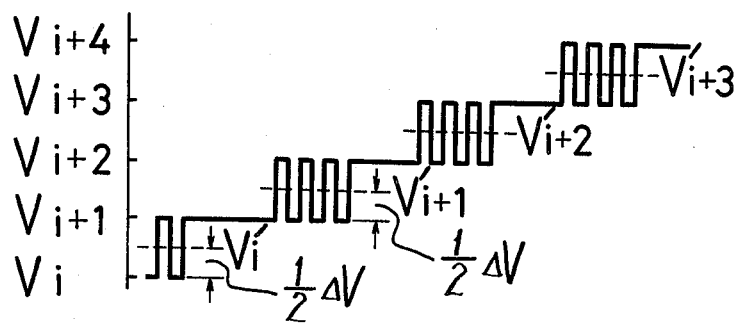

When the resulting digital output produced at the output terminal 7 is converted back to an analog level, as shown in FIG. 2E, the gradual level change of the input analog signal 8a or 8b appears as a voltage level which periodically alternates several times at the clock pulse signal frequency $f_{cp}$ between successive quantizing levels. For example, the gradually-rising signal alternates between quantizing levels $V_{i+1}$ and $V_{i+2}$ for a number of periods of the clock pulse signal CLK, and then remains at the quantizing level $V_{i+2}$ for the next several such periods.

The digital output signal can be converted in a conventional digital-to-analog converter, and restored to analog form by passing the quantized signal of FIG. 2E through a low-pass filter. In such case, the digital-to-analog converted signal can be provided as shown in FIG. 2E. Alternatively, the converted signal can be provided as a pulse amplitude modulated (PAM) waveform, and the digital-to-analog converted PAM output waveform can be processed in a deglitch circuit.

When the digital-to-analog converted signal of FIG. 2E is passed through a low-pass filter, additional analog output levels of $V_i'(=V_{i+1}+\frac{1}{2}\Delta V)$, $V_{i+1}'(=V_{i+1}+\frac{1}{2}\Delta V)$, . . . midway between the respective quantizing levels $V_i$, $V_{i+1}$, . . . are provided. In other words, in addition to the 256 comparing levels $V_i$, $V_{i+1}$, . . . which are possible with an 8-bit code, there are an additional 256 levels $V_i'$, $V_{i+1}'$, . . . each shifted by a voltage $\frac{1}{2}\Delta V$ from the corresponding comparing levels $V_i$, $V_{i+1}$, . . . In other words, there are an equivalent of 512 ($=2^9$) comparing levels provided for the quantization of the analog input signal, which is the equivalent of converting the analog signal into nine-bit bytes. However, the digitized signal can be converted back to analog form with a conventional eight-bit digital-to-converter.

Thus, as set forth hereinabove, with the above-described embodiment of the present invention using a pair of analog-to-digital converters 5a and 5b, each producing bytes of N bits, conversion to digital form can be carried out at twice the speed of either of the analog-to-digital converters, and a digital signal having an accuracy the equivalent of N+1 bits can be provided. Therefore, the analog-to-digital converting circuit of this invention is well suited for carrying out analog-to-digital conversion where high operating speed and resolution are required, such as in the digitizing of a color video signal.

The digitizing operation carried out by the present invention is especially effective when applied to an analog input signal whose level changes only very slowly, but where small quantizing errors are rather conspicuous. One example of such a signal is a video signal having portions in which the brightness changes quite moderately. An analog-to-digital converting circuit according to this invention is especially well suited for use with video signals, because the quantizing errors associated with such portions thereof can be made small, and therefore relatively inconspicuous.

Figure 3:
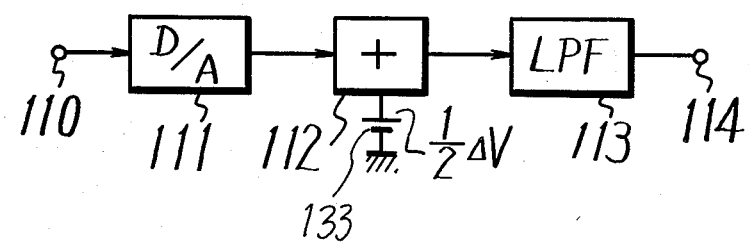
FIG. 3 is a block diagram showing a digital-to-analog converting circuit for converting to analog form the digital signal provided by the embodiment of FIG. 1.
Figure 4:
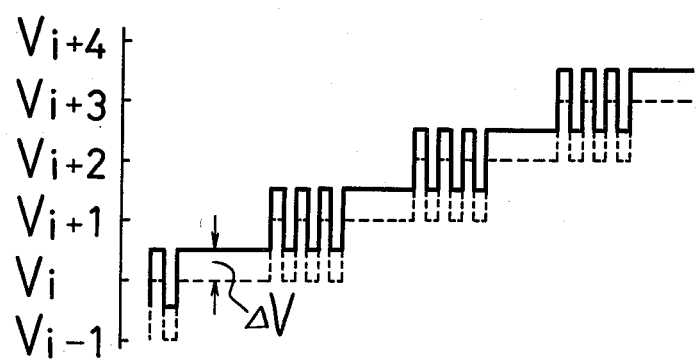
FIG. 4 is a waveform diagram used to explain the operation of the digital-to-analog converting circuit of FIG. 3.

A circuit for converting the digital output signal, such as that illustrated in FIG. 2E, back to analog form is illustrated in FIG. 3. Such digital signal is provided through an input terminal 110 to a digital-to-analog converter 111. An output thereof, corresponding to the analog circuit shown in FIG. 2E, and also corresponding to that shown by a broken line in FIG. 4, is produced at an output thereof. This analog output is furnished to an input of an adder 112, and an offset correction voltage of $\frac{1}{2}\Delta V$ is supplied from an offset voltage source 133 to another input of the adder 112. Then, an analog output signal level-shifted by $\frac{1}{2}\Delta V$ to its correct level, as illustrated in a solid line in FIG. 4, is furnished through a low-pass filter 113 to an analog output terminal 114. It should be appreciated that the analog-to-digital converting circuit illustrated in FIG. 3 compensates for the offset error introduced by the subtractor 3 and offset voltage source 33 of the embodiment of FIG. 1. The analog-to-digital converting circuit of FIG. 3 is especially useful when accurate signal measurements are required.

It should be noted that in the case of a digital video signal, any DC offset error, such as that corrected by the adder 112 in FIG. 3, can be corrected merely by the usual clamping of the pedestal level to a predetermined level. Thus, in the case of digital video playback apparatus, the adder 112 and offset correction voltage source 133 may be omitted without degrading the quality of the converted analog output signal.

While a preferred embodiment of this invention has been described hereinabove with reference to the accompanying drawings, it should be understood that the invention is not limited to that precise embodiment, and that many variations and modifications will be apparent to those of ordinary skill without departure from the scope and spirit of the invention, as defined in the appended claims.

I claim:

1. An analog-to-digital converting circuit comprising input means for receiving an analog signal to be converted to digital form; clock signal generating means for generating first and second control clock signals having the same frequency but having a half-cycle phase difference therebetween; first and second analog-to-digital converting stages each having an input coupled to said input means for receiving the input analog signal, a control terminal for receiving a respective one of said first and said second control clock signals, and an output providing an N-bit binary coded digital signal representing the level of said analog signal, and each having a voltage quantizing step of $\Delta V$; an output terminal; multiplexing means for alternately applying to said output terminal the binary coded digital signals of said first and second analog-to-digital converting stages; and offset means for providing to one of said first and second analog-to-digital converting stages an offset voltage, relative to the other of such stages, of $\frac{1}{2}\Delta V$, such that the digital signals provided at said output terminal have an accuracy of $\frac{1}{2}\Delta V$.

2. An analog-to-digital converting circuit according to claim 1, wherein each of said analog-to-digital converting stages includes a sample hold circuit having an input to receive the input analog signal, a sampling pulse input terminal coupled to receive the respective one of said first and second control clock signals, and an output; and a converter having an input connected to the output of the associated sample hold circuit, and an output providing said N-bit binary coded digital signal.

3. An analog-to-digital converting circuit according to claim 1, wherein said multiplexing means includes a parallel-to-serial converter having respective signal inputs coupled to said outputs of said first and second analog-to-digital converting stages, and an output coupled to said output terminal.

4. An analog-to-digital converting circuit according to claim 3, wherein said parallel-to-serial converter also includes a clock input terminal coupled to receive a clock signal having twice the frequency of said control clock signals such that digital signals appearing at the signal inputs thereof are alternately passed to the output thereof as alternating the N-bit signals from said first converting stage and from said second converting stage.

5. An analog-to-digital converting circuit according to claim 1, wherein said offset means includes a combining circuit having an input connected to said input means, an output connected to the input of said first converting stage, and another input coupled to a source of said offset voltage $\frac{1}{2}\Delta V$.

6. An analog-to-digital converting circuit according to claim 5, wherein said combining circuit is a subtractor.

7. An analog-to-digital converting circuit according to claim 1, wherein each of said analog-to-digital converting stages includes a voltage comparator for comparing the voltage level of said input analog signal with a reference voltage; and said offset means includes shifting means for shifting the level of said reference voltage by $\frac{1}{2}\Delta V$ in one of said first and said second converting stages.

8. A digital-to-analog converting circuit for converting back to analog form the digital signals provided by the encoder according to claim 1, comprising input means for receiving the digital signals; a digital-to-analog converting stage having an input coupled to said input means and an output providing an output analog signal whose level corresponds to said digital signals, said digital-to-analog converting stage having a voltage quantizing step of $\Delta V$; and offset correction means providing an offset correction voltage of $\frac{1}{2}\Delta V$ to said output analog signal.

9. A digital-to-analog converting circuit according to claim 8, wherein said offset correction means includes a combining circuit having an input coupled to said output of said digital-to-analog converting stage, another input coupled to a source of offset correction voltage $\frac{1}{2}\Delta V$, and an output providing the offset-corrected output analog signal.

* * * * *